United States Patent
Ma

(10) Patent No.: US 6,826,052 B2
(45) Date of Patent: Nov. 30, 2004

(54) RETAINING ASSEMBLY FOR HEAT SINK

(75) Inventor: Hao-Yun Ma, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/375,294

(22) Filed: Feb. 26, 2003

(65) Prior Publication Data

US 2004/0001318 A1 Jan. 1, 2004

(30) Foreign Application Priority Data

Jun. 28, 2002 (TW) .................................... 91209756 U

(51) Int. Cl.[7] ................................................ H05K 7/20
(52) U.S. Cl. ...................... 361/709; 361/710; 361/702; 361/703; 361/695; 257/706; 257/718; 257/719; 165/80.3
(58) Field of Search ................................. 361/702–704, 361/707, 709, 690, 694, 695, 697, 717–719, 722; 165/80.3, 185; 257/706, 707, 712, 713, 717–719, 722, 727, E23.083, E23.086

(56) References Cited

U.S. PATENT DOCUMENTS

| | | | | |
|---|---|---|---|---|
| 4,679,118 A | * | 7/1987 | Johnson et al. | 361/718 |
| 5,371,652 A | * | 12/1994 | Clemens et al. | 361/704 |
| 6,093,961 A | * | 7/2000 | McCullough | 257/718 |
| 6,105,215 A | * | 8/2000 | Lee | 24/458 |
| 6,205,026 B1 | * | 3/2001 | Wong et al. | 361/704 |
| 6,222,731 B1 | * | 4/2001 | Katsui | 361/697 |
| 6,226,185 B1 | * | 5/2001 | Lin | 361/704 |
| 6,295,203 B1 | * | 9/2001 | Lo | 361/704 |
| 6,373,703 B2 | * | 4/2002 | Johnson et al. | 361/704 |
| 6,462,951 B2 | * | 10/2002 | Letourneau | 361/704 |
| 6,672,374 B1 | * | 1/2004 | Lin | 165/121 |
| 2002/0118513 A1 | * | 8/2002 | Koseki et al. | 361/709 |

* cited by examiner

*Primary Examiner*—Anatoly Vortman
(74) *Attorney, Agent, or Firm*—Wei Te Chung

(57) ABSTRACT

A heat sink retaining assembly includes a retaining module (1) and a pair of clips (3). Two retaining portions (12) are respectively formed on each of two opposite sidewalls (17') of the retaining module. Bifurcated block portions (13) are integrally formed on interior faces of each of four sidewalls (17, 17') of the retaining module. A gap (15) is defined between each block portion and its corresponding sidewall, and each gap receives a resilient member (14). Each resilient member includes a guide portion (19) and a pressing portion (18). A heat sink (2) is received in the retaining module via the guide portions. The heat sink is restricted by the pressing portions from sliding in lateral directions relative to the retaining module. The clips are engaged with the retaining portions. The heat sink is thereby securely fastened to the retaining module and to an associated CPU package.

19 Claims, 3 Drawing Sheets

RETAINING ASSEMBLY FOR HEAT SINK

BACKGROUND OF THE INVENTION

1. Field of the Invention

The present invention relates to a retaining assembly for a heat sink, and particularly to a retaining assembly which restricts unwanted lateral movement of the heat sink and maintains good contact between the heat sink and an associated heat-generating device such as a central processing unit (CPU).

2. Description of the Related Art

With the development of electronics and computer technology, many electronic components have become highly integrated and very powerful. A typical such component is a CPU, and heat generated by modern CPUs is considerable. Excessive heat can adversely affect the operational stability of CPUs. Typically, a heat sink is mounted on a CPU to dissipate heat therefrom. This ensures normal operation of the CPU.

A conventional means of fastening a heat sink to a CPU uses a clip. However, retaining force acting on the heat sink is generally in vertical directions only. The heat sink is liable to be displaced in lateral directions when it is subjected to vibration or shock during normal use. For a typical Land Grid Array (LGA) CPU, the CPU is connected to an LGA socket by a plurality of elastic pads. If the heat sink is displaced a considerable distance, the CPU is prone to be separated from the socket thereby disrupting electrical connection between the CPU and the socket. For a typical Pin Grid Array (PGA) CPU, the CPU is connected to a CPU socket by a plurality of pins. This configuration can tolerate lateral sliding to a certain extent. However, if the heat sink greatly is displaced a considerable distance, the CPU is still prone to be separated from the socket thereby disrupting electrical connection between the CPU and the socket.

To overcome these problems, a heat sink retaining device which prevents lateral sliding of a heat sink is desired.

BRIEF SUMMARY OF THE INVENTION

Accordingly, an object of the present invention is to provide a heat sink retaining assembly which restricts lateral sliding of a heat sink and thereby maintains good electrical contact between an associated CPU and an associated CPU socket.

To achieve the above object, a heat sink retaining assembly of the present invention includes a retaining module and a pair of clips. Two retaining portions are respectively formed on each of two opposite sidewalls of the retaining module. A plurality of bifurcated block portions is integrally formed on interior faces of each of four sidewalls of the retaining module. A gap is defined between each block portion and its corresponding sidewall, and each gap receives a resilient member. Each resilient member includes a guide portion and a pressing portion. A heat sink is received in the retaining module via the guide portions. The heat sink is restricted by the pressing portions from sliding in lateral directions relative to the retaining module. The clips are engaged with the retaining portions of the retaining module. The heat sink is thereby securely fastened to the retaining module and to an associated CPU package.

Other objects, advantages and novel features of the present invention will be drawn from the following detailed description of a preferred embodiment of the present invention with the attached drawings, in which:

DETAILED DESCRIPTION OF THE INVENTION

Figure 1:
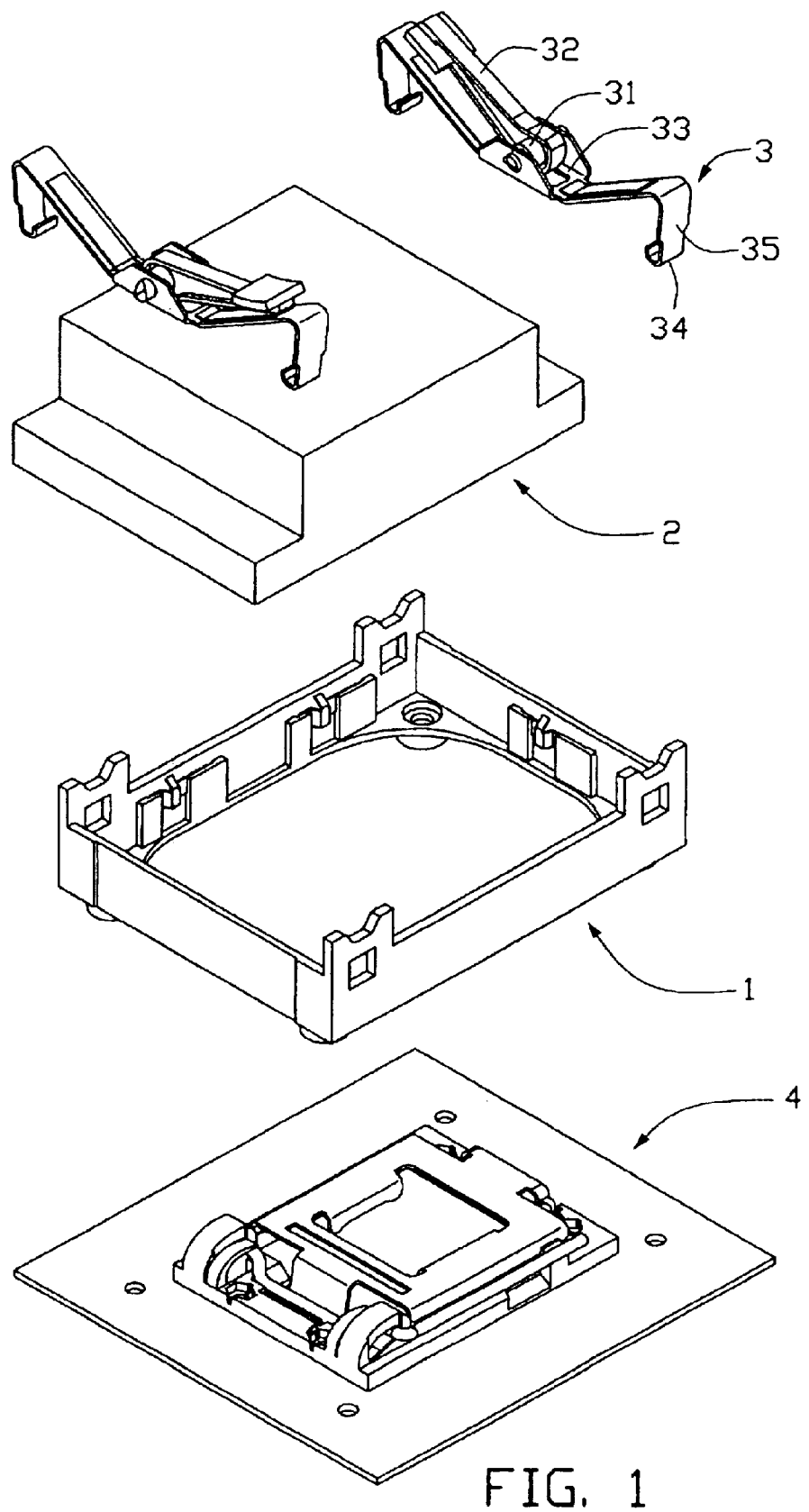
FIG. 1 is an exploded isometric view of a heat sink retaining assembly in accordance with a preferred embodiment of the present invention, together with a heat sink and a CPU package that is mounted on a motherboard.
Figure 2:
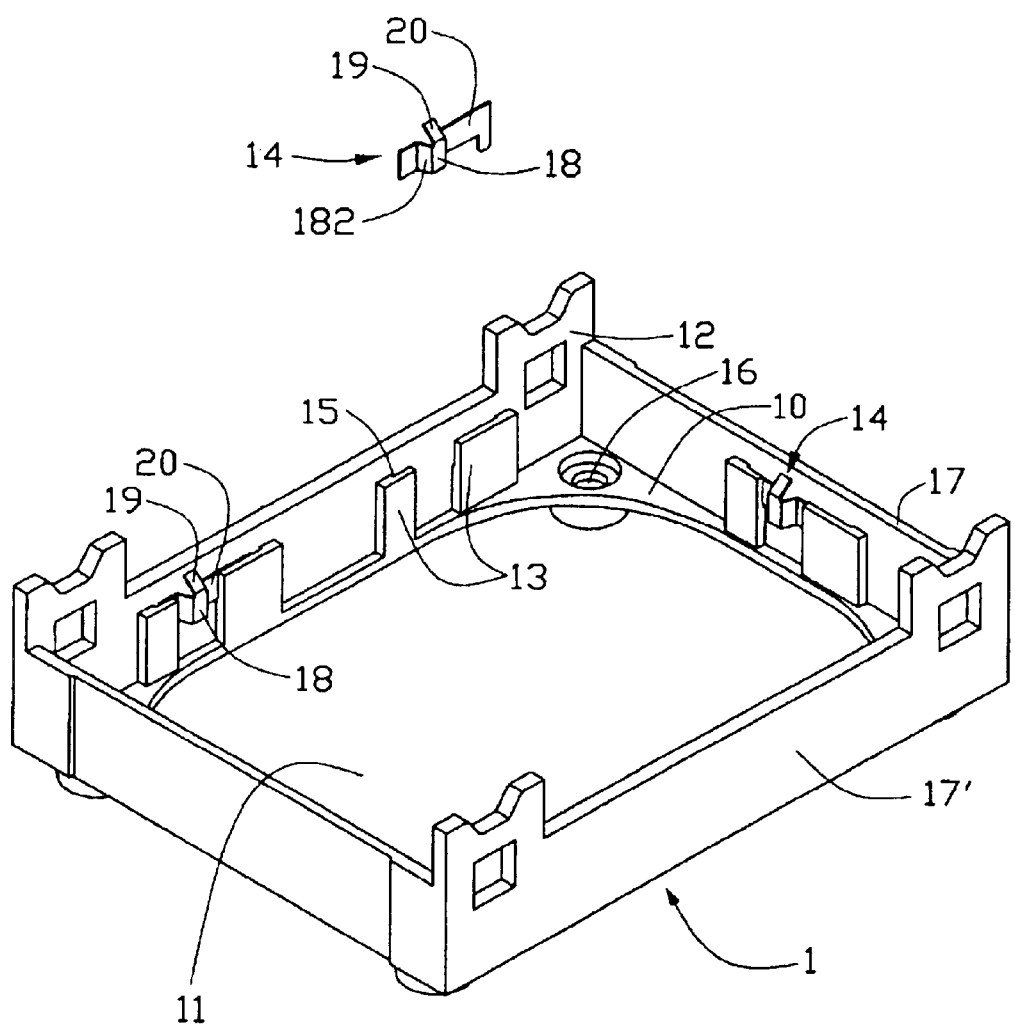
FIG. 2 is an enlarged exploded isometric view of a retaining module of the retaining assembly of FIG. 1.
Figure 3:
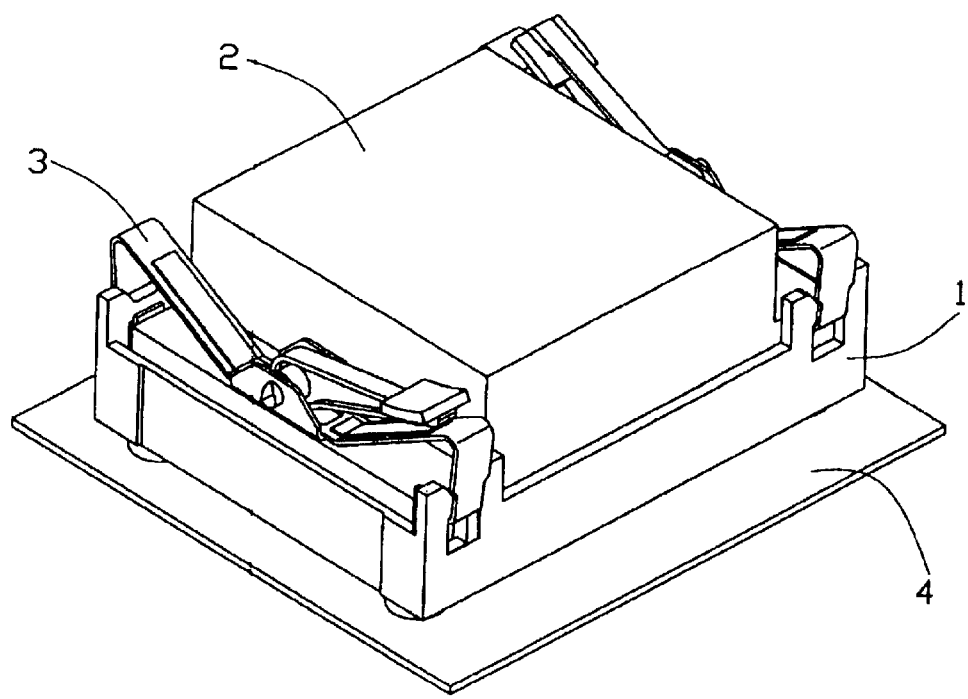
FIG. 3 is an assembled view of FIG. 1.

Referring to FIGS. 1, 2 and 3, a retaining assembly in accordance with a preferred embodiment of the present invention comprises a retaining module 1 and a pair of clips 3. The retaining assembly is for mounting a heat sink 2 onto a CPU package (not labeled) that itself is mounted on a motherboard 4.

The retaining module 1 comprises a rectangular base 10, a pair of parallel first walls 17 extending perpendicularly upwardly from two opposite edges of the base 10 respectively, and a pair of parallel second walls 17' extending perpendicularly upwardly from another two opposite edges of the base 10 respectively. The second sidewalls 17' are perpendicular to and respectively connect between the first sidewalls 17. A pair of spaced retaining portions 12 is provided at top parts of each of the second sidewalls 17'. Each retaining portion 12 may comprise a protrusion, or alternatively may define a hole. In the preferred embodiment, each retaining portion 12 defines a hole (not labeled). An opening 11 is defined in a center of the base 10, for receiving the CPU package therein. Four holes 16 are defined in four corners of the base 10 respectively, for mounting of the retaining module 1 on the motherboard 4 using screws. A bifurcated block portion 13 is integrally formed on an internal face of each first sidewall 17. A pair of bifurcated block portions 13 is integrally formed on an internal face of each second sidewall 17'. A gap 15 is defined between each block portion 13 and its corresponding sidewall 17, 17', for receiving a resilient member 14 therein.

Each resilient member 14 includes a central offset pressing portion 18, a slanted guide portion 19 extending upwardly from the pressing portion 18, two oblique spring portions 182 respectively extending from opposite ends of the pressing portion 18, and two wedge portions 20 respectively extending from free ends of the spring portions 182. The wedge portions 20 are coplanar with each other.

Each clip 3 is substantially an elongate strip. The clip 3 comprises a central horizontal portion 33, and two resilient arms 35 depending from opposite ends of the central portion 33 respectively. A hook 34 is formed at a distal end of each resilient arm 35, for engaging with a corresponding retaining portion 12 of the retaining module 1. A cam structure 31 is pivatably attached to in the central horizontal portion 33, and a handle 32 extends from the cam structure 31.

In assembly, the retaining module 1 is mounted on the motherboard 4 around the CPU package. The wedge portions 20 of the resilient members 14 are engaged in the gaps 15 of the retaining module 1. The resilient members 14 are thus fastened to the retaining module 1. The heat sink 2 is pressed onto the retaining module 1. The guide portions 19 of the resilient members 14 guide the heat sink 2 into the retaining module 1 until the heat sink 2 is resiliently held between the pressing portions 18 of the resilient members 14. The heat sink 2 is thus restricted by the pressing portions 18 from sliding in lateral directions relative to the retaining module 1. The hooks 34 of each clip 3 are engaged with corresponding retaining portions 12 of the retaining module 1. The handle 32 of each clip 3 is rotated so that the cam structure 31 presses against the heat sink 2 and causes the central horizontal portion of the clip 3 to resiliently deform upwardly. The heat sink 2 is thereby securely fastened to the CPU package and the retaining module 1.

In alternative embodiments of the present invention, other kinds of resilient clips can be used instead of the above-described clips 3 of the preferred embodiment of the present invention.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A retaining assembly for retaining a heat sink on an electronic device, the retaining assembly comprising:

a retaining module for surrounding the heat sink, the retaining module comprising a plurality of sidewalls, at least one retaining portion provided at each of two opposite of the sidewalls respectively, at least one block portion provided at an inner face of at least one of the sidewalls, and at least one resilient member engaging with the at least one block portion for pressing the heat sink thereby preventing the heat sink from moving in lateral direction relative to the retaining module, the at least one resilient member comprising a pressing portion and a guide portion adjacent the pressing portion; and at least one clip engaging with corresponding retaining portions of the retaining module, adapted for pressing the heat sink toward the electronic device thereby preventing the heat sink from moving in a vertical direction relative to the retaining module.

2. The retaining assembly as claimed in claim 1, wherein the at least one block portion is integrally formed on the inner face of the at least one of the sidewalls of the retaining module.

3. The retaining assembly as claimed in claim 1, wherein the at least one block portion is bifurcated.

4. The retaining assembly as claimed in claim 1, wherein at least one gap is defined between the at least one block portion and the at least one of the sidewalls of the retaining module.

5. The retaining assembly as claimed in claim 4, wherein the at least one resilient member further comprises two oblique spring portions extending from opposite ends of the pressing portion.

6. The retaining assembly as claimed in claim 5, wherein two wedge portions extend from free ends of the spring portions, and at least one of the wedge portions engage in the at least one gap.

7. The retaining assembly as claimed in claim 1, wherein the at least one clip comprises a central portion, two resilient arms extending from the central horizontal portion, and two hooks arranged at distal ends of the resilient arms engaging with the retaining portions.

8. The retaining assembly as claimed in claim 7, wherein the at least one clip further comprises a cam structure pivotally attached on the central portion, and a handle extending from the cam structure.

9. A retaining module for fastening a heat sink to an electronic device, the retaining module comprising:

a base defining an opening in a center thereof for extension of the electronic device;

four sidewalls arranged at four sides of the base respectively for surrounding the heat sink and the electronic device; and at least one resilient member detachably arranged on an interior face of at least one of the sidewalls for pressing the heat sink thereby preventing the heat sink from moving in lateral direction relative to the electronic device.

10. The retaining module as claimed in claim 9, wherein a hole is defined in each corner of the base.

11. The retaining module as claimed in claim 9, wherein at least one retaining portion is provided at a top of each of two opposite of the sidewalls respectively.

12. The retaining module as claimed in claim 9, wherein at least one block portion is provided at an inner face of at least one of the sidewalls.

13. The retaining module as claimed in claim 12, wherein the at least one block portion is integrally formed with the at least one of the sidewalls of the retaining module.

14. The retaining module as claimed in claim 12, wherein the at least one block portion is bifurcated.

15. The retaining module as claimed in claim 9, wherein at least one gap is defined between the at least one block portion and the at least one of the sidewalls, the at least one gap receiving the at least one resilient member.

16. The retaining module as claimed in claim 9, wherein the at least one resilient member comprises a pressing portion and a guide portion adjacent the pressing portion.

17. The retaining module as claimed in claim 9, wherein the at least one resilient member further comprises two oblique spring portions extending from opposite ends of the pressing portion.

18. The retaining module as claimed in claim 17, wherein two wedge portions extend from free ends of the spring portions, and at least one of the wedge portions engages in the at least one gap.

19. A retaining assembly comprising:

a printed circuit board;

an electronic package assembly mounted on the printed circuit board;

a retaining module mounted on the printed circuit board and surrounding the electronic package assembly;

a heat sink having a base seated upon the electronic package assembly and surrounded by the retaining module;

at least one clip fastening to the retaining module and pressing the heat sink downwardly toward the electronic package assembly; and a plurality of resilient members mounted on an interior periphery of the retaining module; wherein each of said resilient members includes an upward slanted guide portion for resiliently guidably loading the heat sink into the retaining module, and an offset pressing portion located below the guide portion and horizontally inwardly pressing a corresponding side wall of the base of the heat sink.

* * * * *